(12) United States Patent
Cheng et al.

(10) Patent No.: US 7,372,128 B2
(45) Date of Patent: May 13, 2008

(54) INTEGRATED CIRCUIT ANTI-INTERFERENCE OUTLINE STRUCTURE

(75) Inventors: Jean-Jen Cheng, Taipei (TW); Pei-Sung Chuang, Taipei Hsien (TW)

(73) Assignee: Alcor Micro, Corp., Taipei (TW)

( * ) Notice: Subject to any disclaimer, the term of this patent is extended or adjusted under 35 U.S.C. 154(b) by 739 days.

(21) Appl. No.: 10/428,772

(22) Filed: May 5, 2003

(65) Prior Publication Data

US 2007/0295997 A1    Dec. 27, 2007

(51) Int. Cl.
 *H01L 23/552* (2006.01)
 *H01L 29/76* (2006.01)
 *H01L 29/94* (2006.01)
 *H01L 31/062* (2006.01)
 *H01L 31/113* (2006.01)

(52) U.S. Cl. ..................... 257/659; 257/340
(58) Field of Classification Search ............... 257/340, 257/659
 See application file for complete search history.

(56) References Cited

U.S. PATENT DOCUMENTS

| | | | |
|---|---|---|---|
| 4,089,298 A | 5/1978 | Wilson | |
| 4,455,966 A | 6/1984 | Knowles | |
| 4,815,411 A | 3/1989 | Burgess | |
| 4,844,012 A | 7/1989 | Jerrett | |
| 4,880,740 A | 11/1989 | Hoffman | |
| 4,919,079 A | 4/1990 | Morishita | |
| 5,076,210 A | 12/1991 | Horn | |
| 5,117,777 A | 6/1992 | Takasugi | |
| 5,138,975 A | 8/1992 | Walsh | |
| 5,234,581 A | 8/1993 | Rosenberg | |
| 5,309,868 A | 5/1994 | Tomiyama | |
| 5,310,427 A | 5/1994 | Manome | |
| 5,463,983 A | 11/1995 | Naguara | |
| 5,556,536 A | 9/1996 | Turk | |
| 5,572,952 A | 11/1996 | Manome | |
| 5,722,345 A | 3/1998 | Naguara | |
| 5,762,024 A | 6/1998 | Meilahn | |
| 5,968,503 A | 10/1999 | Crawford | |
| 6,033,569 A | 3/2000 | Sumino et al. | |
| 6,050,550 A | 4/2000 | Burgess | |
| 6,059,270 A | 5/2000 | Kurzer et al. | |
| 6,355,950 B1 * | 3/2002 | Livengood et al. | 257/276 |
| 6,657,285 B1 * | 12/2003 | Cheng et al. | 257/659 |

OTHER PUBLICATIONS

Excerpts from Seaplast Canada Website (2000)—www.seaplast. com (products).
Excerpts from Peterson Fiberglass Lammota Inc. (2000)—www .petersonfiberglass.com.

* cited by examiner

*Primary Examiner*—Jerome Jackson
*Assistant Examiner*—Jesse A. Fenty

(57) ABSTRACT

The invention discloses an integrated circuit anti-interference outline structure for applications of integrated circuits capable of shielding the integrated circuit from invasions of external electromagnetic waves and leaks of internal electromagnetic waves, wherein the integrated circuit anti-interference outline structure surrounds a periphery of a partial circuit within the integrated circuit and comprises a plurality of PNP structures. At a surface of the integrated circuits are two metal strips for producing a parasitic capacitance at poly layers in order to control noises within acceptable ranges. On a P-substrate therein is disposed with a deep N-well layer for connecting to an N-terminal of an N-well layer, so as to produce a positive voltage zone having a large area, and thus having noise currents overflow from a ground terminal as well as preventing the integrated circuit from invasions and leaks of electromagnetic waves.

2 Claims, 4 Drawing Sheets

INTEGRATED CIRCUIT ANTI-INTERFERENCE OUTLINE STRUCTURE

BACKGROUND OF THE INVENTION (a) Field of the Invention

The invention relates to an integrated circuit anti-interference outline structure, and more particularly, to an anti-interference outline suitable for disposing within an integrated circuit; wherein two metal strips provided at the surface of the integrated circuit are applied with a positive voltage and connected to GND, respectively, so as to generate a significant parasitic capacitance at poly layers thereof in between, and to further control noises thereof within acceptable ranges; and a P-type substrate therein is provided with a deep N-well for connecting with an N-terminal of an N-well layer, so as to produce a positive voltage zone having a large area such that noises are disallowed to pass through and are instead overflowed through a ground terminal having a lower voltage, thereby shielding the integrated circuit from invasions and leaks of electromagnetic waves.

(b) Description of the Prior Art

Accompanied with advancement of technology, products that we use become better in quality and precision, and therefore it is essential that the integrated circuits contained therein have more exact designs. However, in the internal design of an integrated circuit, the structure therein is made up of electronic circuit layouts, and some noises that interfere with one another are inevitably produced. The phenomenon occurs even more frequently in an integrated circuit for that the integrated circuit is consisted of a great quantity of circuits, and hence it is important to minimize the interference signals. In a prior art, housing shielding and aperture shielding are generally used in combination for screening external noise interferences. However, such method is incapable of entirely eliminating external noise interferences, and only succeeds in isolating external noises but fails to isolate noise interferences at the interior thereof. Also, the internal structure of a prior integrated circuit lacks countermeasures and designs for resolving the aforesaid difficulty; and as closer the circuits in the integrated circuit get with one another, the more likely the noises generated will stray along the circuits, thus seriously affecting stability and quality of the integrated circuit.

In the view of the above shortcomings, the inventor has a patent application Ser. No. 10/189,495, "Domestic Priority Data as Claimed by Applicant", wherein an integrated circuit anti-interference outline structure is provided for solving external and internal noise interferences, and two metal strips and PNP structures of varied amounts are employed to produce parasitic capacitance for isolating external noises, thereby forcing the internal noise currents to overflow through a ground terminal using a positive voltage zone produced, as well as preventing invasions of external noises and interferences of internal noises.

SUMMARY OF THE INVENTION

The object of the invention is to provide an integrated circuit anti-interference outline structure that surrounds a periphery of a partial circuit within an integrated circuit and comprises of a plurality of PNP structures. Wherein, two metal strips are connected to a metal layer and a surface layer of the integrated circuit for providing a positive voltage and a ground terminal, so that a parasitic capacitance is generated at poly layers therein for controlling noises thereof within acceptable ranges, and thereby elevating anti-interference effects against high frequency electromagnetic waves. In addition, a positive voltage zone having a large area is produced by connecting a deep N-well layer to an N-terminal of an N-well layer, so as to have noise currents overflow from the ground terminal and to further shield the integrated circuit from invasions and leaks of electromagnetic waves.

The other object of the invention is to provide an integrated circuit anti-interference outline structure that is formed according to internal circuits of the integrated circuit, and a length thereof is determined based upon the area required for anti-interference of the internal circuits, thus enhancing the anti-interference effects of the integrated circuit per inner unit area. Furthermore, the invention is provided specifically for generating anti-interference effects against electromagnetic waves by combining within CMOS integrated circuits for further utilization.

DESCRIPTION OF THE PREFERRED EMBODIMENTS

Figure 1:
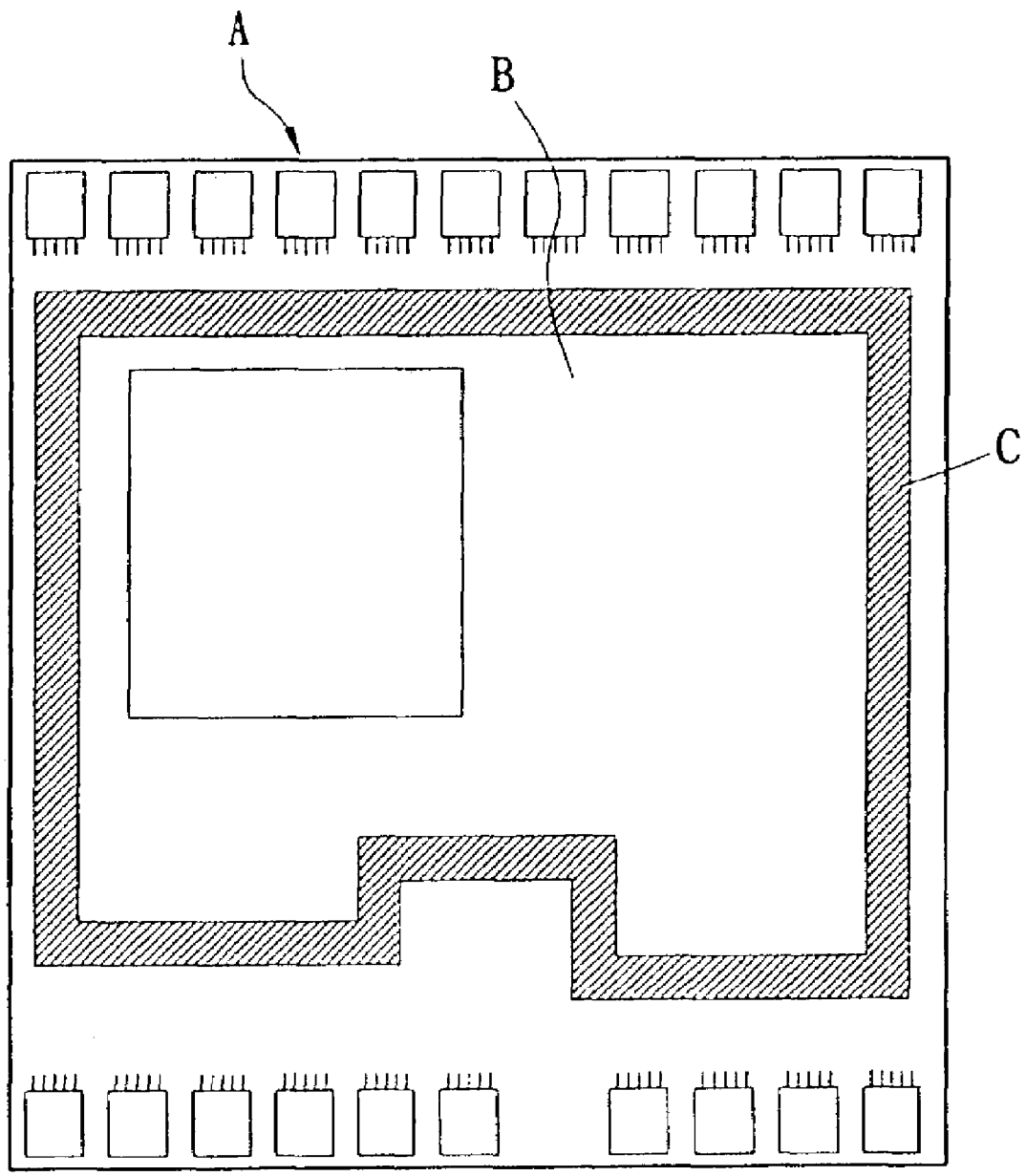
FIG. 1 shows a schematic view of the integrated circuit anti-interference outline structure according to the invention being combined with an integrated circuit.

Referring to FIG. 1 showing the integrated circuit anti-interference outline structure C according to the invention surrounding the periphery of a partial circuit B within an integrated circuit A, the partial circuit B is protected from interference and is a partial circuit C, wherein the integrated circuit anti-interference outline structure C may be laid-out along with the partial circuit B within the integrated circuit A.

Figure 2:
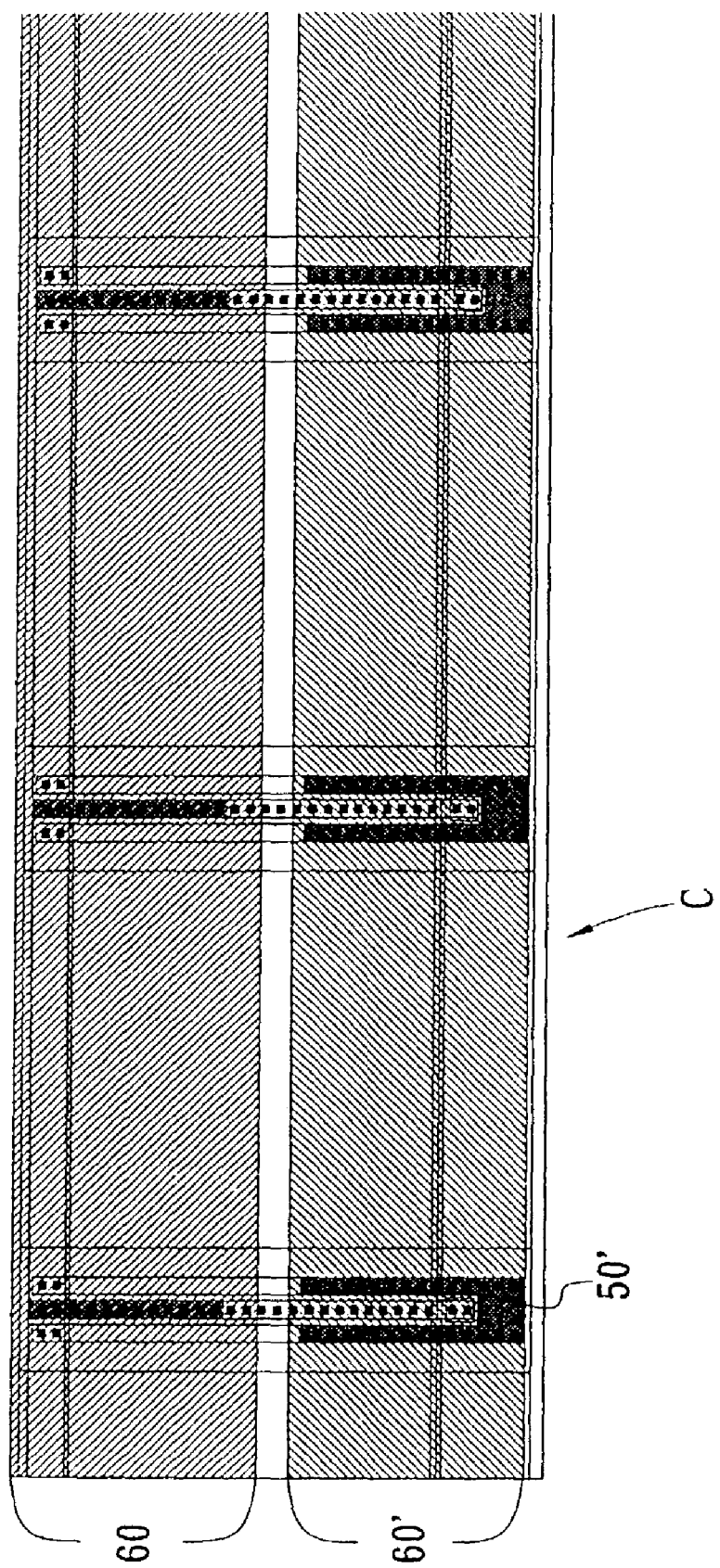
FIG. 2 shows a top view of the integrated circuit anti-interference outline structure according to the invention.
Figures 3, 4:
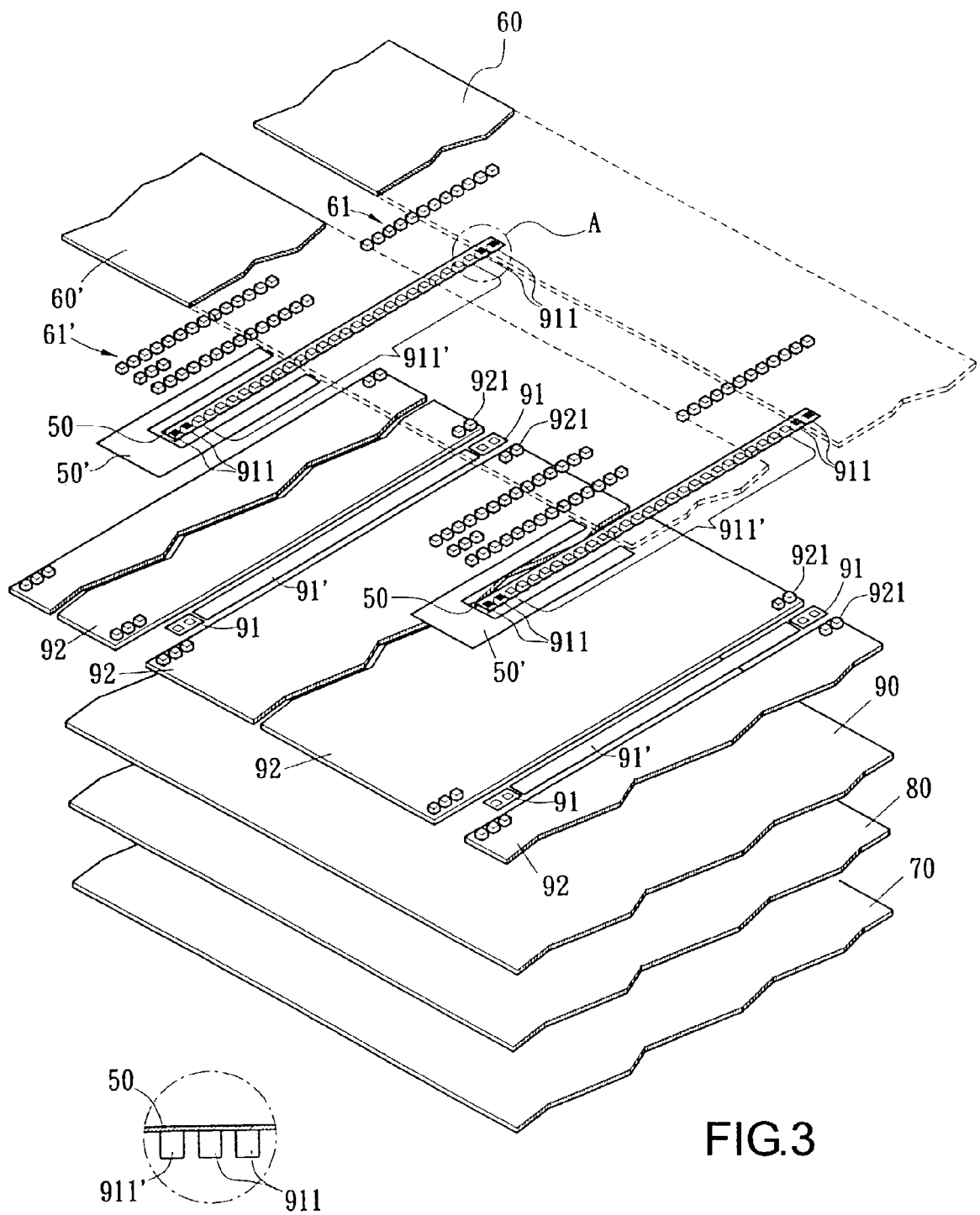
FIG. 3 shows an exploded elevational view of the integrated circuit anti-interference outline structure according to the invention.
FIG. 4 shows a partial enlarged view of the labeled part of the integrated circuit anti-interference outline structure according to the invention illustrated in FIG. 3.

Also referring to FIGS. 2, 3 and 4 showing a top schematic view, an exploded elevational schematic view and an enlarged partial view of the labeled part in FIG. 3, respectively, the integrated circuit anti-interference outline structure C according to the invention comprises a plurality of PNP structures 10, a plurality of poly layers 92, a P+ layer 91', an N− layer 91, a plurality of pairs of metal layers 50 and 50', a Vcc metal strip 60, a GND metal strip 60', and a plurality of contact holes 911, 911', 921, 61 and 61'. On top of a P-substrate layer 70 is formed with a deep N-well layer 80 that is further formed with an N-well layer 90 on the top thereof. The N-well layer 90 is provided with the positive-valence P+ layer 90', the negative-valence N− layer 90, and the poly layers 92; which are connected to the metal layer 50 (metal 1) and the deep N-well layer 80 using the contact holes 911 disposed at the negative-valence N− layer 90, respectively, then are connected to the metal layer 50 using the contact holes 911' disposed at the positive-covalence P+ layer 91', and are further connected to the Vcc metal strip 60

(metal 2) using the contact holes 61, and is applied with a positive voltage to form a source S and a drain D.

Figure 5:
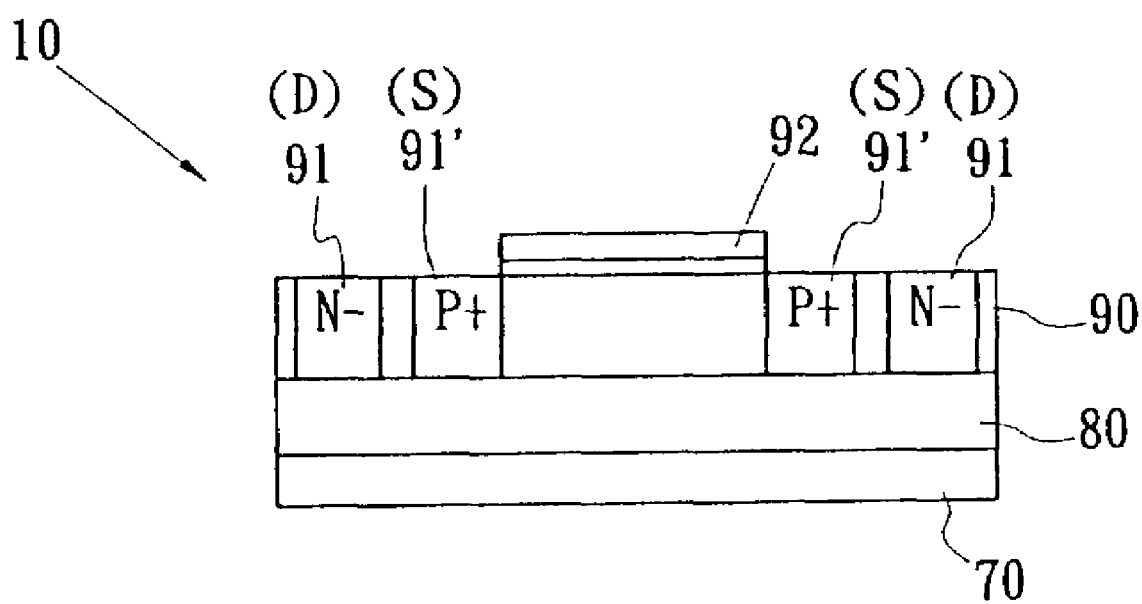
FIG. 5 shows an enlarged sectional view of the integrated circuit anti-interference outline structure according to the invention.

The poly layers 92 are disposed with contact holes 921 for connecting with the metal layer 50', and are connected to the GND metal strip 60' using the contact holes 61' to form a gate G of the GND terminal. From the above, and referring to FIG. 5, the Vcc metal strip 60 and the GND metal strip 60' are able to provide operating powers required by the positive-valence P+ layer 91' and the negative-valence N− layer 91 of the aforesaid PNP structures 10 by connecting to positive and negative pins of the power of the integrated circuit, respectively. Also, the Vcc metal strip 60 is provided with a plurality of contact holes 61 at the bottom thereof for connecting to the aforesaid metal layer 50, so that the positive terminal of the power is induced into the metal layer 50.

Furthermore, at the bottom of the GND metal strip 60' is provided with a plurality of contact holes 61' that connect another metal layer 50' for inducing the negative terminal of the power to the metal layer 50'. By inducing the positive and negative terminals of the power into the metal layers 50 and 50', the aforesaid PNP structures 10, the positive-valence P+ layer 91' and the negative-valence N− layer 91 become operable. That is, a supply from the positive terminal of the power is acquired by the source and drain represented by the positive-valence P+ layer 91' and the negative-valence N− layer 91, and the negative terminal of the power is induced into the poly layers 92, thereby preventing invasion of electromagnetic waves. However, the unit area for the parasitic capacitance and anti-interference, and the magnitude of power supply for anti-interference are not limited to fixed numbers, but may be adjusted appropriately according the layout volumes and areas of the PNP structures 10, the poly layers 20, the positive-valence P+ layer 91', the negative-valence N− layer 91, the metal layers 50 and 50', and the Vcc and GND metal layers 60 and 60'.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. An integrated circuit anti-interference outline structure surrounding a periphery of a partial circuit in the integrated circuit, comprising a Vcc metal strip connected to a Vcc positive voltage and a GND metal strip connected to a GND ground, wherein both the metal strips being connected to partial elements of a CMOS structure are made up by PNP structures, and the PNP structures further comprising:

a deep N-well layer formed on a P-substrate, an N-well layer formed on the deep N-well layer, a P+ layer, an N− layer and poly layers disposed at the N-well layer, contact holes disposed at the N− layer for forming a positive voltage zone by connecting to a metal layer (metal 1) and the deep N-well layer, respectively, contact holes disposed at the P+ layer for connecting to the metal layer (metal 1) that is further connected to the Vcc metal strip through contact holes, and to the other Vcc metal strip (metal 2) through contact holes at the N− layer in order to form a source and a drain; and a GND metal layer (metal 1) connected to poly layers below through contact holes for forming a gate.

2. The integrated circuit anti-interference outline structure according to claim 1, wherein the positive voltage zone comprising an N-well layer and a deep N-well layer.

\* \* \* \* \*